United States Patent [19]

Izumita et al.

[11] 4,283,742
[45] Aug. 11, 1981

[54] SOLID-STATE IMAGING APPARATUS WITH FIXED PATTERN NOISE REDUCTION

[75] Inventors: Morishi Izumita, Inagi; Masuo Umemoto, Hinode; Kazuhiro Sato, Tokyo; Toshiyuki Akiyama, Kokubunji; Kenji Takahashi, Kodaira; Shusaku Nagahara, Hachiouji, all of Japan

[73] Assignee: Hitachi, Ltd., Tokyo, Japan

[21] Appl. No.: 76,814

[22] Filed: Sep. 19, 1979

[30] Foreign Application Priority Data

Sep. 25, 1978 [JP] Japan .................................. 53-116501

[51] Int. Cl.³ .......................... H04N 3/14; H04N 5/30
[52] U.S. Cl. .................................... 358/213; 358/167
[58] Field of Search ................ 358/213, 48, 212, 167, 358/41, 44, 209

[56] References Cited

U.S. PATENT DOCUMENTS

| 3,949,162 | 4/1976 | Malueg | 358/213 |
|---|---|---|---|
| 4,010,319 | 3/1977 | Levine | 358/213 |
| 4,032,975 | 6/1977 | Malueg | 358/213 |
| 4,167,755 | 9/1979 | Nagumo | 358/213 |
| 4,179,711 | 12/1979 | Nagumo | 358/213 |
| 4,189,751 | 2/1980 | Nagumo | 358/213 |

Primary Examiner—Robert L. Griffin
Assistant Examiner—Michael A. Masinick
Attorney, Agent, or Firm—Craig and Antonelli

[57] ABSTRACT

A solid-state imaging apparatus comprising first means for sample-holding spike noise generated from a horizontal switching element constituting the apparatus second means for sample-holding spike noise opposite in phase to the first-mentioned spike noise, and third means for adding outputs of the first and second means.

12 Claims, 26 Drawing Figures

FIG. 2 PRIOR ART
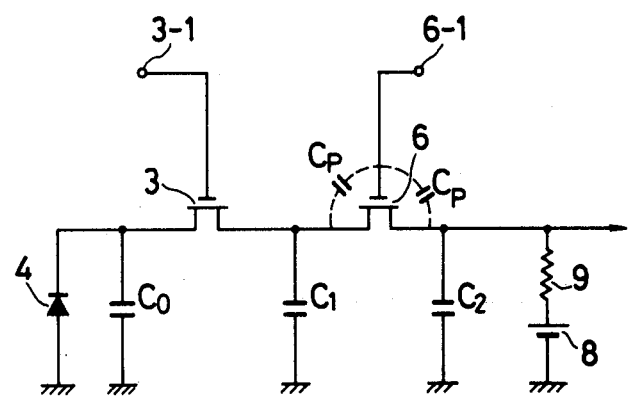
FIG. 3
(A)
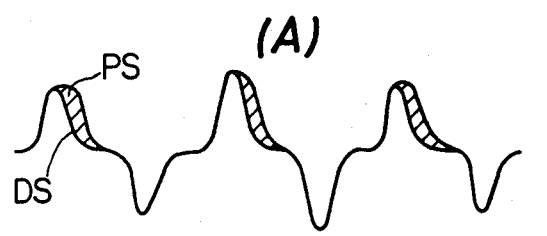
(B)
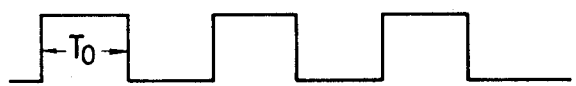

SOLID-STATE IMAGING APPARATUS WITH FIXED PATTERN NOISE REDUCTION

BACKGOUND OF THE INVENTION

This invention relates to a solid-state imaging apparatus. More particularly, it relates to a solid-state imaging apparatus in which fixed pattern noise inherent thereto is reduced.

A solid-state imaging device is considered better than an image pickup tube in points of high stability, long lifetime, low power dissipation, easy handling, etc., and is noted for use in a small-sized television camera. Usually the solid-state imaging device comprises photoelectric elements which are arrayed in two dimensions and which constitute an imaging picture element matrix, switching elements which serve to select (x, y)-coordinates corresponding to the photoelectric elements, and an x (horizontal) scanner and a y (vertical) scanner which turn the switching elements "on" and "off". Here, the operation of the solid-state imaging device will be described with reference to FIG. 1 showing the schematic construction thereof.

In the FIGURE, numeral 1 designates a horizontal scanner for x-addressing, numeral 2 a vertical scanner for y-addressing, numeral 3 a vertical switching MOS transistor which is turned "on" or "off" by a scanning pulse from the scanner 2 (hereinbelow, shortly termed "vertical switch"), numeral 4 a photodiode (photoelectric element) which exploits the source junction of the vertical switch 3, numeral 5 a vertical signal output line to which the drains of the vertical switches 3 are connected in common, and numeral 6 a horizontal switching MOS transistor which is turned "on" or "off" by a scanning pulse from the horizontal scanner 1 (hereinbelow, shortly termed "horizontal switch") and which has its drain connected to a horizontal signal output line 7 and its source connected to the vertical signal output line 5. Shown at 8 is a reference power source which is connected to the horizontal signal output line 7 through a resistor 9. A feature common to solid-state imaging devices is that picture elements are separate elements and that they are scanned by clock pulses externally supplied to the horizontal scanner and the vertical scanner, so the picture element whose signal is presently being read out can be readily discriminated.

Now, a method of reading out signals from the solid-state imaging device of FIG. 1 will be explained with reference to FIG. 2. This figure is a diagram showing an equivalent circuit which includes the single picture element (photodiode), the horizontal and vertical switches and the reference power source.

When no light enters, a predetermined amount of charges $Q_O$ dependent upon the predetermined voltage 8 applied to the element are stored inthe parasitic capacitance $C_O$ of the photodiode 4. Upon incidence of light, charges proportional to the quantity of the incident light are discharged through the photodiode 4. When the vertical switch 3 is turned "on" by the signal of the vertical scanner introduced through a terminal 3-1 and the horizontal switch 6 is turned "on" by the signal of the horizontal scanner introduced through a terminal 6-1, current flows from the reference power source 8 so as to supply charges corresponding to the discharged component, and the parasitic capacitance $C_O$ of the photodiode 4 is charged again up to the quantity $Q_O$. The signal is read out by detecting the inflowing current by means of the load resistor 9. $C_1$ and $C_2$ denote parasitic capacitances which are formed due to the structure of the device. The signal is read out with a time constant which is decided by these capacitances and the "on" resistance of the horizontal switch 6 as well as the load resistance 9. FIG. 3(A) shows a waveform of output signals sequentially derived through the horizontal signal output line 7 from the horizontal switching elements 6. In the figure, a differential waveform DS indicates spike noise generated from the horizontal switching element 6, and a portion PS depicted by oblique lines indicates a photo signal derived from the photoelectric element 4 selected by the vertical and horizontal switching elements 3 and 6 as a result of capacitances $C_P$ between the gate and source and between the gate and drain of the horizontal switch 6. The output signal shown in FIG. 3(A) includes the photo signal PS and the spike noise DS. Since the photo signal PS is smaller than the spike noise DS, in the figure, the output signal is depicted as a waveform in which the photo signal PS is superposed on the spike noise DS. Since the waveform of the spike noise DS varies in each horizontal switching element as shown in the figure, it becomes "fixed pattern noise" which deteriorates picture quality. $T_O$ indicated in FIG. 3(B) denotes the "on" time of the horizontal switch 6.

SUMMARY OF THE INVENTION

This invention has been made in view of the disadvantage described above, and has for its object to provide a solid-state imaging apparatus which has the fixed pattern noise eliminated and which has good picture quality.

In order to accomplish the object, this invention eliminates the fixed pattern noise by exploiting the fact that spike noise forming an important factor for the fixed pattern noise is substantially equal in magnitude and opposite in phase in the rise and fall of the switching pulse of one horizontal switching element.

BRIEF DESCRIPTION OF THE DRAWINGS

FIG. 2 is a diagram showing an equivalent circuit of a signal reading-out circuit in the device of FIG. 1, FIGS. 3(A-B) are waveform diagrams for explaining fixed pattern noise.

DESCRIPTION OF THE PREFERRED EMBODIMENTS

Figure 1:
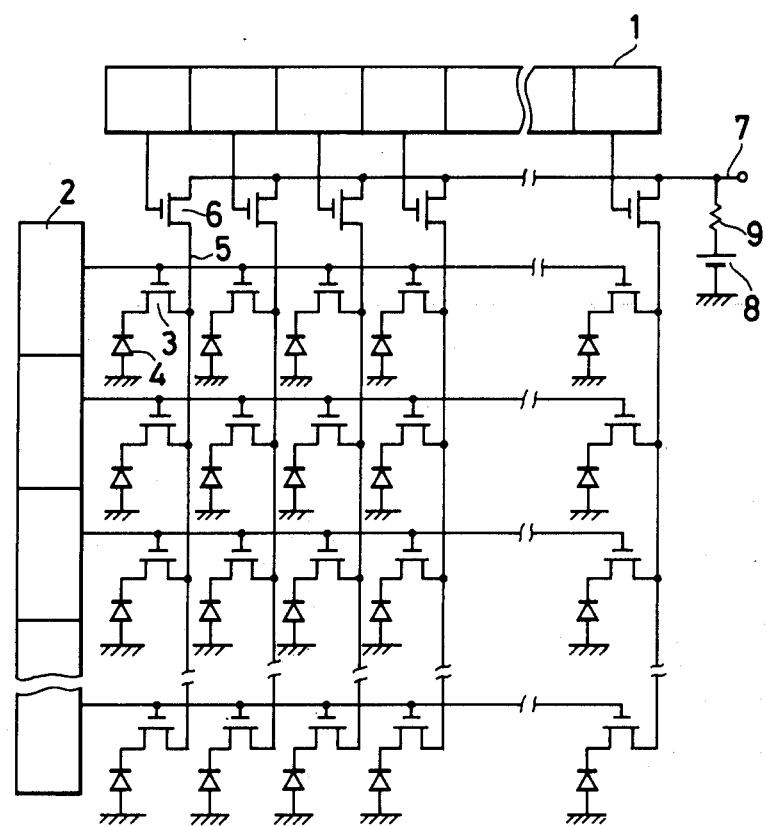
FIG. 1 is a diagram showing the schematic construction of a prior-art solid-state imaging device.
Figure 4:
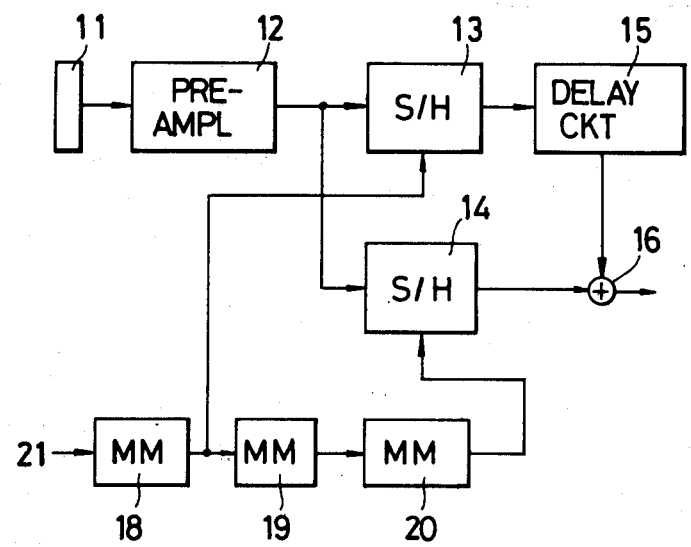
FIG. 4 is a diagram showing the construction of an embodiment of this invention, FIGS. 5(A-G) are waveform diagram for explaining the operation of the embodiment shown in FIG. 4.
Figure 5:
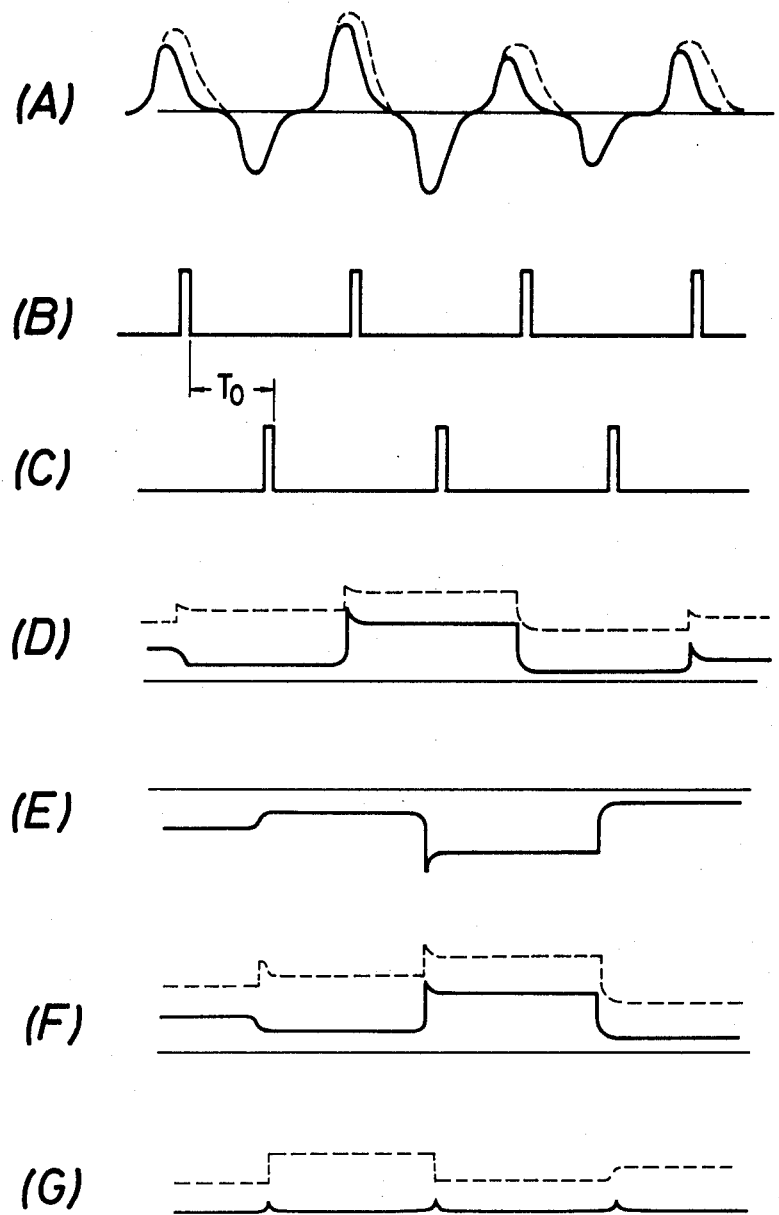

FIG. 4 shows a block diagram of an embodiment of a signal processing circuit according to this invention, while FIG. 5 shows signal waveform diagrams corresponding to the embodiment. In FIG. 5, photo signal components are indicated by dotted lines and the solid line indicates spike noise. In FIG. 4, numeral 11 designates the solid-state imaging device shown in FIG. 1. An output signal (FIG. 5(A)) from the imaging device 11 is applied through a preamplifier 12 to two sample-holding circuits 13 and 14 (abbreviated to "S/H" circuits), and the resultant outputs are sample-held by sampling pulses indicated at (B) and (C) in FIG. 5, into signals indicated at (D) and (E) in FIG. 5 respectively. The signal shown in FIG. 5(D) indicates the output signal of S/H circuit 13 which sample-holds the signal shown in FIG. 5(A) by a sampling pulse shown in FIG. 5(B). Therefore, the circuit 13 sample-holds the photo signal and spike noise of the signal shown in FIG. 5(A). The signal shown in FIG. 5(E) indicates the output signal of S/H circuit 14 which sample holds the signal shown in FIG. 5(A) by sampling pulse shown in FIG. 5(C). The sampling pulse shown in FIG. 5(C) is delayed from the sampling pulse shown in FIG. 5(B) by the "On" time $T_O$ of the horizontal switch 6. The spike noise included in the signal shown in FIG. 5(A) is substantially equal in magnitude and opposite in phase (or polarity) in the rise and fall of the switching pulse of one horizontal switching element so that spike noise shown in FIG. 5(E) held by the circuit 14 is substantially equal in magnitude and opposite in polarity to the spike noise held by the circuit 13, and the spike noise shown in FIG. 5(E) held by the circuit 14 is delayed time $T_O$ from the signal shown in FIG. 5(D). By means of a delay circuit 15, the signal of FIG. 5(D) is delayed by time $T_O$ and becomes a signal shown in FIG. 5(F). Thus, there is no time difference between the signal shown in FIG. 5(E) and the signal shown in FIG. 5(F). Since the signal shown in FIG. 5(E) (which includes only the spike noise) is substantially equal in magnitude and opposite in polarity to the spike noise included in the signal shown in FIG. 5(F), the signal shown in FIG. 5(E) added with the signal shown in FIG. 5(F) in an adder circuit 16 becomes the signal shown in FIG. 5(G) with only a small amount of the spike noise included therein. As a result, fixed pattern noise is significantly reduced. The sampling pulses of the S/H circuits 13 and 14 can be readily formed by monostable multivibrators 18, 19 and 20 with reference to a horizontal clock pulse 21 which drives the horizontal scanner of the imaging device 11.

Figure 6:
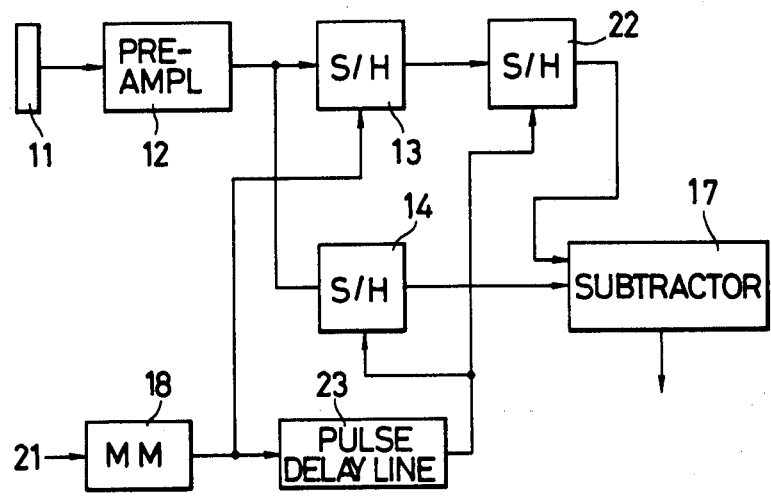
FIG. 6 is a diagram showing the construction of another embodiment of this invention, FIGS. 7(A-D) are waveform diagrams for explaining the operation of the embodiment shown in FIG. 6.
Figure 7:
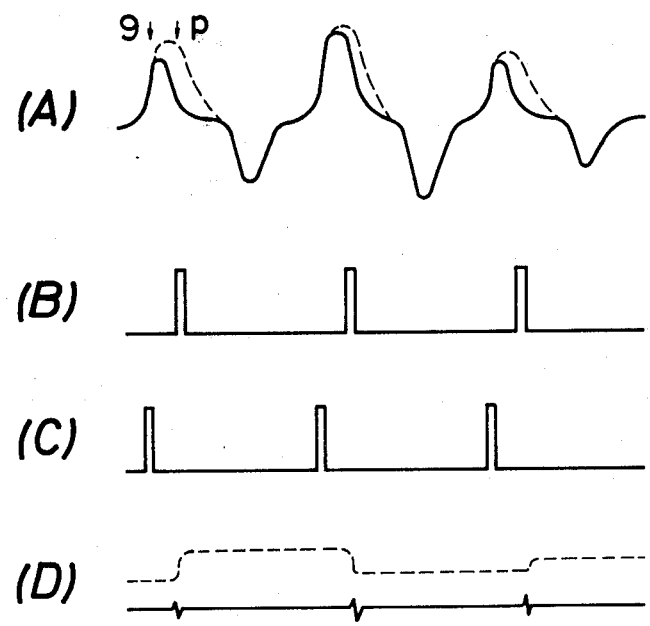

Another embodiment of this invention is illustrated in FIGS. 6 and 7. FIG. 6 shows a block diagram of a signal processing circuit embodying this invention, while FIG. 7(A-D) shows waveform diagrams for explaining the operation of the embodiment.

According to the present embodiment, a signal free from spike noise is obtained in such a way that a point p of an output signal from the imaging device indicated at (A) of FIG. 7 and a point q at which the spike noise is substantially equal in magnitude to that at the point p are sample-held, that the signal sample-held at the point q is delayed up to the point p and that the difference between the delayed signal and the signal at the point p is obtained. The output of the imaging device 11 shown at (A) of FIG. 7 is applied to the S/H circuits 13 and 14, and the resultant outputs are sample-held by pulses shown at (C) and (B) in FIG. 7 respectively. The point p of the output signal shown in FIG. 7(A) indicates the time sample-held by the sampling pulse shown in FIG. 5(B) in a S/H circuit 14. As a result, the photo signal (indicated by the dotted line in FIG. 7(A)) and the spike noise (indicated by the solid line in FIG. 7(A)) are sample-held by the circuit 14. The point q of the signal shown in FIG. 7(A) indicates the time sample-held by sampling pulse shown in FIG. 7(C) in a S/H circuit 13. As a result, the spike noise substantially equal in magnitude and identical in polarity to the spike noise held by the S/H circuit 14 is sample-held by the S/H circuit 13. The output of the S/H circuit 14 is delayed from the output of the S/H circuit 13 by the time difference between the pulse shown in FIG. 7(B) and the pulse shown in FIG. 7(C). The output of the S/H circuit 13 sample-held by the pulse shown in FIG. 7(B) in a S/H circuit 22 so as to delay the output of the S/H circuit 13 by such time difference. Since the output signal (which includes only the spike noise) of the S/H circuit 22 is substantially equal in magnitude and identical in polarity to the spike noise included in the output signal of the S/H circuit 14, the output signal of the S/H circuit 22 subtracted from that of the S/H circuit 14 in a subtractor 17 becomes a signal free from spike noise as shown at (D) in FIG. 7, and fixed pattern noise is significantly reduced. The sampling pulses (B) and (C) can be readily formed by the monostable multivibrator 18 and a pulse delay line 23 with reference to the horizontal clock pulse 21.

Figure 8:
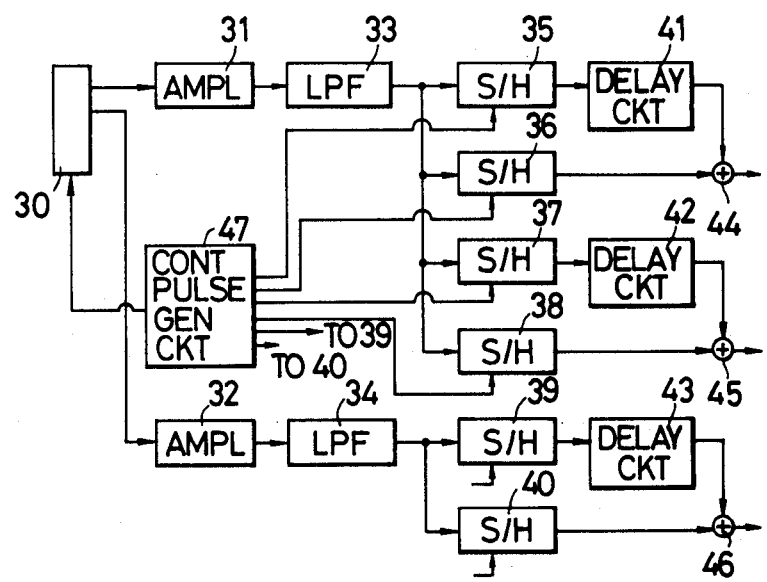
FIG. 8 is a diagram showing the construction of still another embodiment of this invention, and FIGS. 9(A-G) are waveform diagrams for explaining the operation of the embodiment shown in FIG. 7.
Figure 9:
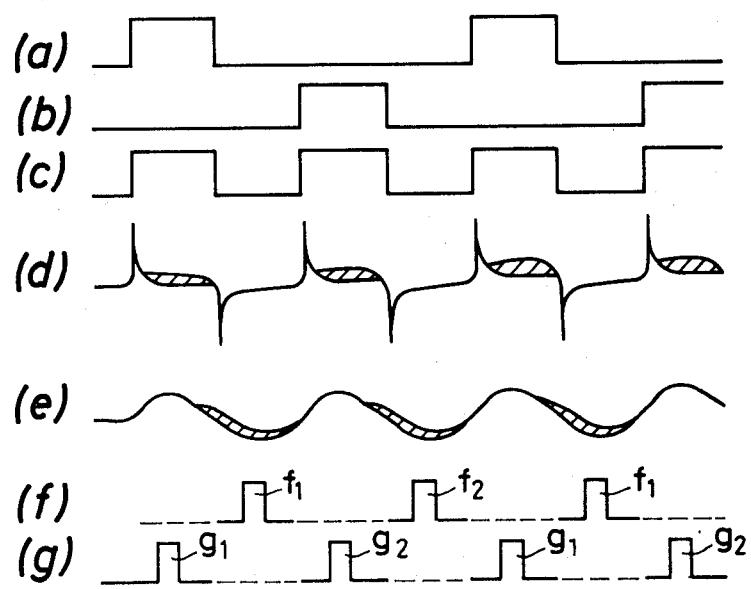

FIG. 8 is a diagram showing the third embodiment in which this invention is applied to a color solid-state imaging device. Referring to the figure, numeral 30 designates a single plate type color solid-state imaging device, which has a structure providing a signal for green and alternate signals for red and for blue at its two output terminals. Such structure is described in, for example, the specification of U.S. Pat. Application Ser. No. 923,982. It is now assumed that the two-phase clock pulses of the horizontal scanner of the imaging device 30 are at 3.58 MHz respectively and that the horizontal scanning pulses are at 7.16 MHz. The red or blue signal and the green signal having passed through amplifiers 31 and 32 are applied to low-pass filters (LPFs) 33 and 34, respectively. The LPFs 33 and 34 permit the passage of signal components which are not higher than 7 MHz. Thus, the higher harmonics component of 7.16 MHz is cut off to enhance the signal-to-noise ratio. Numerals 35, 36, 37, 38, 39 and 40 indicate S/H circuits, respectively, which sample desired signals at respective timings. Numerals 41, 42 and 43 indicate delay circuits, respectively. Numerals 44, 45 and 46 indicate adder circuits, which provide the red signal, the blue signal and the green signal free from the fixed pattern noise, respectively. Shown at 47 is a control pulse generator circuit. FIG. 9 shows the waveforms of various parts in the embodiment of FIG. 8. FIG. 9(a) and (b) illustrate the two-phase clock pulses of the horizontal scanner of the imaging device 30, while FIG. 9(c) illustrates the horizontal scanning pulses, in other words, the switching pulses for the horizontal switches. FIG. 9(d) illustrates the output waveform of the imaging device 30, in which a hatched part is a photo signal portion. FIG. 9(e) illustrates the output waveforms of the LPFs 33 and 34, in which a hatched part is a photo signal portion. In (f) of FIG. 9, $f_1$ indicates the sampling pulse of the S/H circuit 36 and 40, and $f_2$ the sampling pulse of the S/H circuit 38 and 40. In (g) of FIG. 9, $g_1$ indicates the sampling pulse of the S/H circuit 35 and 39, and $g_2$ the sampling pulse of the S/H circuit 37 and 39. As understood by comparing (d) and (e) in FIG. 9, the phasic relationship of the sampling pulses is different from that in the case of FIG. 5 because the photo signal portions are delayed by the LPFs.

In the above embodiments, there has been described the case where the timing of the first sampling lies at the position at which the signal becomes the maximum and where the second sampling is effected at the position at which the spike noise (inphase or antiphase) having the same magnitude as at the position of the first sampling. However, even when the position of the second sampling deviates more or less, adjustments may be made so as to minimize the fixed pattern noise by varying the proportion of addition or subtraction.

By employing this invention thus far described in detail, it is possible to reduce the fixed pattern noise to below half those in the prior art and to put the solid-state imaging apparatus into practical use.

We claim:

1. In a solid-state imaging apparatus having photoelectric elements which form picture elements and switch means for individually reading out signals derived from said photoelectric elements, the solid-state imaging apparatus further comprising first and second sample-holding means for obtaining samples of a signal having noise therein derived from said switch means and holding said samples, pulse generator means for applying sampling pulses to said first and second sample-holding means at predetermined times different from each other, and calculating means for subjecting outputs from said first and second sample-holding means to predetermined calculations for reducing the noise in the signal derived from said switch means and for providing a reduced noise output signal.

2. A solid-state imaging apparatus according to claim 1, wherein said calculating means further includes delay means for adjusting the period of time between the output of the first sample-holding means and the output of the second sample-holding means.

3. In a solid-state imaging apparatus having photoelectric elements which are arrayed in two dimensions, a plurality of first switching elements whose input terminals are connected to the corresponding photoelectric elements, a plurality of second switching elements whose input terminals are connected to output terminals of the first switching elements, a first scanner which applies first scanning pulses to control terminals of the first switching elements, a second scanner which applies second scanning pulses to control terminals of the second switching elements, and at least one read-out line to which output terminals of the second switching elements, the solid-state imaging apparatus further comprising first and second sample-holding circuits connected to said read-out line for obtaining and holding samples of signals having noise therein derived through said read-out line from each said second switching element, a pulse generator connected to said first and second sample-holding circuits for applying sampling pulses to said first and second sample-holding circuits at predetermined times different from each other, and calculating means connected to said first and second sample-holding circuits for subjecting outputs from said first and second sample-holding circuits to predetermined calculations to reduce the noise in the signal derived through said read-out line and for providing a reduced noise output signal.

4. A solid-state imaging apparatus according to claim 3, wherein said calculating means comprises delay means connected to the output of said first sample-holding circuit for adjusting the period of time between the output of said first sample-holding circuit and the output of said second sample-holding circuit, and a calculating circuit connected to the output of said delay means and said output of the second sample-holding circuit for subjecting outputs from said delay means and said second sample-holding circuit to predetermined calculations to reduce the noise in the signal derived through said read-out line.

5. A solid-state imaging apparatus according to claim 4, wherein said delay means includes a delay circuit for delaying the output of said first sample-holding circuit by a time difference between said predetermined times of said pulse generator.

6. A solid-state imaging apparatus according to claim 4, wherein said delay means includes a third sample-holding circuit connected to the output of said first sample-holding circuit for sampling and holding the output of said first sampling-holding circuit, said pulse generator being connected to said third sample-holding circuit for applying the sampling pulse applied to said second sample-hold circuit thereto.

7. A solid-state imaging apparatus according to claim 3, wherein one of said predetermined times of said pulse generator is selected at a time at which a photo signal of each said photoelectric element is read out from said read-out line and the other of said predetermined times is selected at a time at which a signal substantially equal in magnitude to spike noise included in said photo signal is read out from said read-out line.

8. A solid-state imaging apparatus according to claim 6, wherein one of said predetermined times of said pulse generator is a first time and the other of said predetermined times is a second time delayed from said first time by a conduction time of the second switching element.

9. A solid-state imaging apparatus according to claim 4, wherein said calculating circuit includes an adder circuit connected to receive the outputs from said delay means and said second sample-holding circuit.

10. A solid-state imaging apparatus according to claim 4, wherein said calculating circuit includes a subtractor connected to receive the outputs from said delay means and said second sample-holding circuit.

11. A solid-state imaging apparatus according to claim 3, wherein said first and second switching elements are horizontal and vertical switching elements, respectively, and said first and second scanners are horizontal and vertical scanners, respectively.

12. A solid-state imaging apparatus according to one of claims 3 or 11, wherein said second switching elements are MOS transistors.

* * * * *